(12) United States Patent
Cheng et al.

(10) Patent No.: US 10,930,778 B2
(45) Date of Patent: Feb. 23, 2021

(54) VERTICAL TRANSISTOR DEVICES WITH COMPOSITE HIGH-K AND LOW-K SPACERS WITH A CONTROLLED TOP JUNCTION

(71) Applicant: INTERNATIONAL BUSINESS MACHINES CORPORATION, Armonk, NY (US)

(72) Inventors: Kangguo Cheng, Schenectady, NY (US); Chen Zhang, Albany, NY (US); Xin Miao, Guilderland, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 7 days.

(21) Appl. No.: 16/157,896

(22) Filed: Oct. 11, 2018

(65) Prior Publication Data

US 2020/0119190 A1     Apr. 16, 2020

(51) Int. Cl.
| | |
|---|---|
| *H01L 21/82* | (2006.01) |
| *H01L 21/76* | (2006.01) |
| *H01L 21/02* | (2006.01) |
| *H01L 21/28* | (2006.01) |
| *H01L 29/78* | (2006.01) |
| *H01L 29/06* | (2006.01) |
| *H01L 29/66* | (2006.01) |
| *H01L 29/51* | (2006.01) |
| *H01L 29/49* | (2006.01) |

(52) U.S. Cl.
CPC ...... *H01L 29/7827* (2013.01); *H01L 29/0649* (2013.01); *H01L 29/4966* (2013.01); *H01L 29/518* (2013.01); *H01L 29/6656* (2013.01); *H01L 29/66666* (2013.01)

(58) Field of Classification Search
CPC ................................................. H01L 21/823487
See application file for complete search history.

(56) References Cited

U.S. PATENT DOCUMENTS

| | | |
|---|---|---|
| 9,245,885 B1 | 1/2016 | Xie et al. |
| 9,252,233 B2 | 2/2016 | Hsiao et al. |
| 9,337,057 B2 | 5/2016 | Park et al. |

(Continued)

OTHER PUBLICATIONS

Jacob et al., "Scaling Challenges for Advanced CMOS Devices", International Journal of High Speed Electronics and Systems. vol. 26, Nos. 1&2. Mar. 2017. pp. 1-76.

(Continued)

*Primary Examiner* — Omar F Mojaddedi
(74) *Attorney, Agent, or Firm* — Tutunjian & Bitetto, P.C.; Douglas Pearson

(57) ABSTRACT

A method of forming a vertical fin field effect transistor device is provided. The method includes forming a vertical fin and fin template on a bottom source/drain layer, wherein the fin template is on the vertical fin. The method further includes forming a gate structure on the vertical fin and fin template, and forming a top spacer layer on the gate structure. The method further includes removing the fin template to form an opening in the top spacer layer, and removing a portion of a gate electrode of the gate structure to form a cavity; and removing a portion of a gate dielectric layer of the gate structure to form a groove around the vertical fin.

9 Claims, 9 Drawing Sheets

(56) References Cited

U.S. PATENT DOCUMENTS

| | | |
|---|---|---|
| 9,761,728 B1 | 9/2017 | Cheng et al. |
| 9,780,192 B2 | 10/2017 | Niimi et al. |
| 9,805,935 B2 | 10/2017 | Anderson et al. |
| 10,008,578 B1 | 6/2018 | Lee et al. |
| 2010/0270611 A1* | 10/2010 | Masuoka ............ H01L 29/0847 257/329 |
| 2013/0023095 A1* | 1/2013 | Nojima ............. H01L 29/66666 438/268 |
| 2015/0303305 A1 | 10/2015 | Ching et al. |
| 2017/0110550 A1 | 4/2017 | Tsai et al. |
| 2018/0122806 A1 | 5/2018 | Li |

OTHER PUBLICATIONS

Sarat K. Saluru, "Projection of TaSiOx/In0.53Ga0.47As Tri-gate transistor performance for future Low-Power Electronic Applications", MastersTheses submitted to Virginia Polytechnic Institute and State University, Electrical Engineering Department. May 3, 2017. pp. 1-125.

* cited by examiner

VERTICAL TRANSISTOR DEVICES WITH COMPOSITE HIGH-K AND LOW-K SPACERS WITH A CONTROLLED TOP JUNCTION

BACKGROUND

Technical Field

The present invention generally relates to vertical fin field effect transistor devices, and more particularly to vertical fin field effect transistor devices with modified top source/drain junctions.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a vertical fin field effect transistor device is provided. The method includes forming a vertical fin and fin template on a bottom source/drain layer, wherein the fin template is on the vertical fin. The method further includes forming a gate structure on the vertical fin and fin template, and forming a top spacer layer on the gate structure. The method further includes removing the fin template to form an opening in the top spacer layer, and removing a portion of a gate electrode of the gate structure to form a cavity; and removing a portion of a gate dielectric layer of the gate structure to form a groove around the vertical fin.

In accordance with another embodiment of the present invention, a method of forming a vertical fin field effect transistor device is provided. The method includes forming a vertical fin and fin template on a substrate, wherein the fin template is on the vertical fin. The method further includes forming a gate dielectric layer on the vertical fin and fin template, and forming a gate electrode on the gate dielectric layer. The method further includes forming a top spacer layer on the gate electrode and gate dielectric layer. The method further includes removing the fin template to form an opening in the top spacer layer, and removing a portion of the gate electrode to form a cavity. The method further includes removing a portion of the gate dielectric layer to form a groove around the vertical fin, and forming a gate plug in the groove.

In accordance with yet another embodiment of the present invention, a vertical fin field effect transistor device is provided. The vertical fin field effect transistor device includes a vertical fin on a substrate, and a gate dielectric layer on the vertical fin. The transistor device further includes a gate plug around an upper portion of the vertical fin, and a dielectric collar on the gate plug.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a composite high-K and low-K spacer adjoining an upper portion of a vertical fin and top source/drain to form an improved top junction with controlled overlap of the upper extension region. The overlap of the top source/drain and extension region with the gate structure affects parasitic capacitances, while the dopant concentration of the extension region affects the source/drain to channel resistance.

Embodiments of the present invention provide a method of forming a composite high-K and low-K spacer adjoining an upper portion of a vertical fin and top source/drain by forming a cavity and grooves around the vertical fin.

Embodiments of the present invention provide a vertical fin field effect transistor device with an improved top junction using a lower thermal budget by forming a gate spacer having both a high-K portion and a low-K portion around the vertical fin and upper extension region. The high-k dielectric portion can be placed at the corner of the gate structure and fin device channel to enhance the gate coupling to the device channel and thus reduce the top source/drain extension resistance. The low-k dielectric portion is a majority part of the gate spacer, where the low-k dielectric portion can reduce the parasitic capacitance between gate electrode and top source/drain. In various embodiments, the low-k dielectric portion can be at least partially replaced with an air gap.

Embodiments of the present invention provide a vertical fin field effect transistor device with an improved top junction without using a replacement metal gate fabrication process. Removal of a dummy gate layer is thereby avoided.

Exemplary applications/uses to which the present invention can be applied include, but are not limited to: logic devices (e.g., NAND gate circuits, NOR gate circuits, inverters, etc.) and memory devices (e.g., static random access memory (SRAM), dynamic access memory (DRAM).

It is to be understood that aspects of the present invention will be described in terms of a given illustrative architecture; however, other architectures, structures, substrate materials and process features and steps can be varied within the scope of aspects of the present invention.

Figure 1:
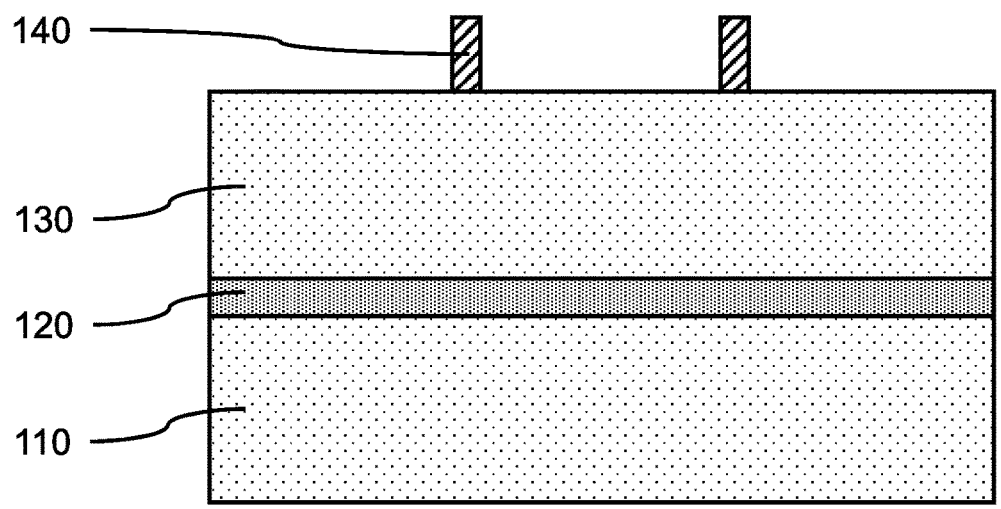
FIG. 1 is a cross-sectional side view showing a bottom source/drain layer on a substrate, a fin layer on the bottom source/drain layer, and a plurality of fin templates on the fin layer, in accordance with an embodiment of the present invention.

Referring now to the drawings in which like numerals represent the same or similar elements and initially to FIG. 1, a cross-sectional side view of a bottom source/drain layer on a substrate, a fin layer on the bottom source/drain layer, and a plurality of fin templates on the fin layer is shown, in accordance with an embodiment of the present invention.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)). In various embodiments, the substrate 110 can be a single crystal wafer.

In one or more embodiments, a bottom source/drain layer 120 can be formed on a substrate 110, where the bottom source/drain layer 120 can be formed by implantation and/or an epitaxial or heteroepitaxial growth process, for example, molecular beam epitaxy (MBE), liquid phase epitaxy (LPE), or gas phase epitaxy (GPE). The bottom source/drain layer 120 can be doped to be an n-type bottom source/drain layer or a p-type bottom source/drain layer, where the dopant(s) can be introduced in situ (i.e., during formation of a layer) or ex situ (i.e., after formation of a layer). In various embodiments, n-type dopants can be, for example, phosphorus (P) or arsenic (As), and p-type dopants can be, for example, boron (B) or gallium (Ga). In various embodiments, the bottom source/drain layer 120 can be a semiconductor material, including, but not limited to n-type (e.g., P or As) doped silicon (Si) or p-type (e.g., B) doped silicon-germanium (SiGe). The bottom source/drain layer 120 can be the same semiconductor material as the substrate 110 or different.

In various embodiments, the bottom source/drain layer 120 can have a thickness in a range of about 10 nm to about 40 nm, or about 20 nm to about 30 nm, although other thicknesses are also contemplated.

In one or more embodiments, a fin layer 130 can be formed on the bottom source/drain layer 120 and substrate 110, where the fin layer can be formed by an epitaxial or heteroepitaxial growth process. The fin layer 130 can have the same crystal orientation as the substrate 110 and bottom source/drain layer 120.

In various embodiments, the fin layer 130 can be a semiconductor material, where the fin layer 130 can be the same semiconductor material as the substrate 110 and/or the bottom source/drain layer 120, or the fin layer 130 can be a different semiconductor material than the substrate 110 and/or the bottom source/drain layer 120. Use of a different semiconductor material for the fin layer 130 can be used to impart a stress in the fin layer.

In various embodiments, a fin template 140 can be formed on the fin layer 130 as part of a lithography or patterning process, where the fin templates 140 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

Figure 2:
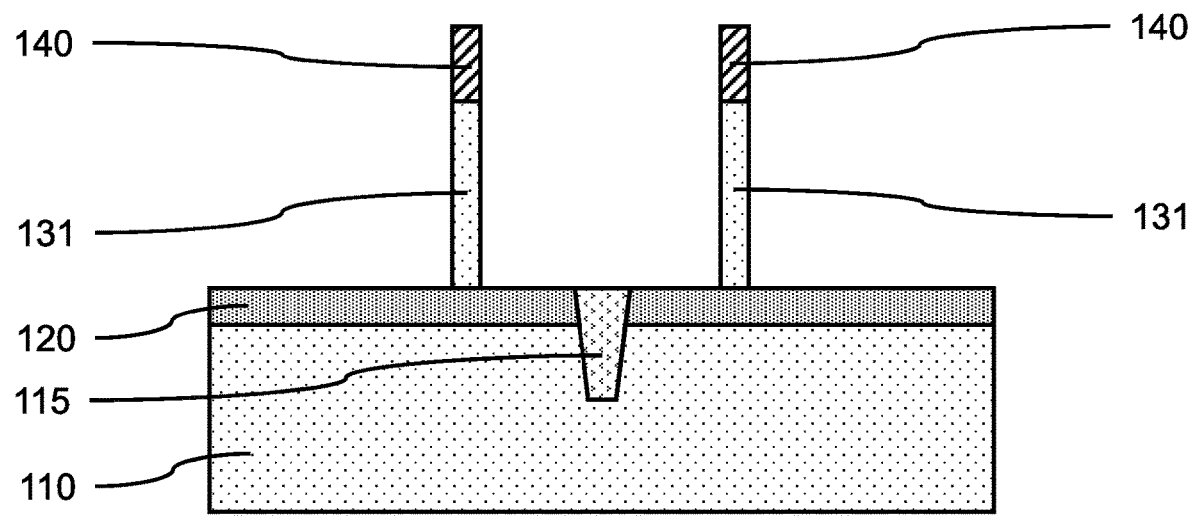
FIG. 2 is a cross-sectional side view showing a plurality of vertical fins on the bottom source/drain layer, and a fin template on each of the vertical fins, in accordance with an embodiment of the present invention.

FIG. 2 is a cross-sectional side view showing a plurality of vertical fins on the bottom source/drain layer, and a fin template on each of the vertical fins, in accordance with an embodiment of the present invention.

In one or more embodiments, one or more vertical fins 131 can be formed on the bottom source/drain layer 120 and substrate 110. The vertical fins 131 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 131 may be formed by a direct write process or double patterning process using, for example, immersion lithography, extreme ultraviolet lithography, or x-ray lithography. The fin templates 140 can be formed from a fin template layer previously formed on the fin layer 130, as part of the patterning process.

In various embodiments, the widths of the semiconductor vertical fin(s) 130 can be in a range of about 5 nanometers (nm) to about 15 nm, or about 6 nm to about 10 nm, or about 6 nm to about 8 nm, although other widths are also contemplated.

In various embodiments, the height of the semiconductor vertical fin(s) 130 can be in a range of about 20 nanometers (nm) to about 100 nm, or about 30 nm to about 50 nm, although other heights are also contemplated. Although the vertical fins 111 are depicted in the figures perpendicular to the substrate 110 (i.e., having a 90 degree angle), the fins can have a tapered sidewall that does not meet the substrate at a right angle (i.e., not exactly 90 degree). The top surface of the vertical fins 130 may not be perfectly flat or rectangular, but may have a convex curved surface. The substrate surface can have a curved (recessed) profile between the vertical fins 130. In various embodiments, the bottom source/drain layer 120 can be formed after formation of the vertical fin(s) 130, where the bottom source/drain layer can be formed by dopant implantation.

In one or more embodiments, an isolation region 115 can be formed through the bottom source/drain layer 120 to electrically separate the bottom source/drain layer into different segments below the vertical fins 131. The isolation region(s) 115 can be formed by etching a trench through the bottom source/drain layer 120 and into the substrate, and filling the trench with a dielectric material, for example, silicon oxide (SiO).

Figure 3:
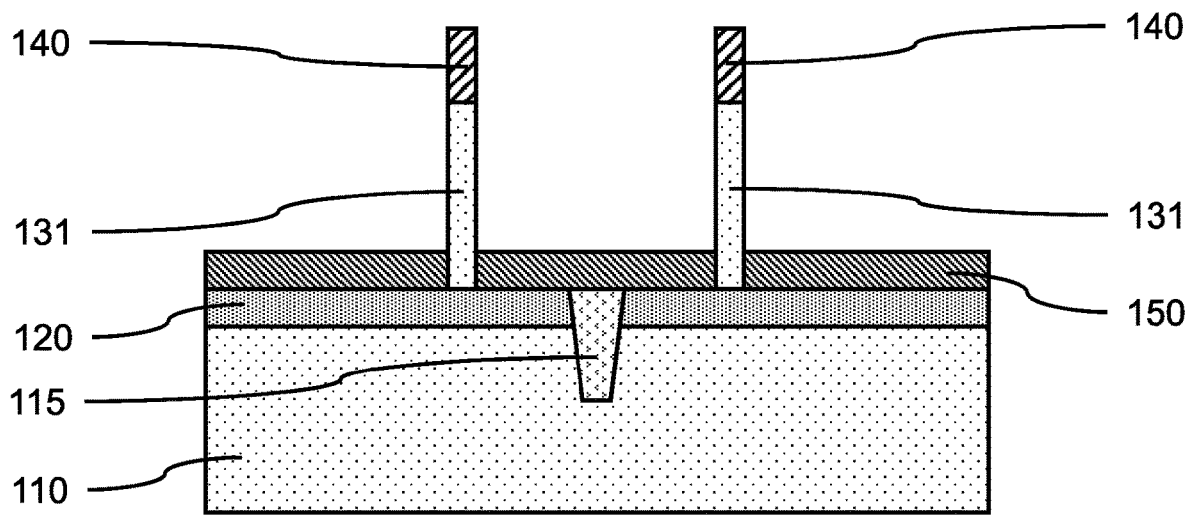
FIG. 3 is a cross-sectional side view showing a bottom spacer layer formed on the bottom source/drain layer and the plurality of vertical fins, in accordance with an embodiment of the present invention.

FIG. 3 is a cross-sectional side view showing a bottom spacer layer formed on the bottom source/drain layer and the plurality of vertical fins, in accordance with an embodiment of the present invention.

In one or more embodiments, a bottom spacer layer 150 can be formed on the bottom source/drain layer 120, where the bottom spacer layer 150 can be formed by a directional deposition to a predetermined thickness, for example, by a high density plasma (HDP) or gas cluster ion beam (GCIB), or by a blanket deposition, for example, chemical vapor deposition (CVD) or plasma enhanced CVD (PECVD) and etched back to an intended thickness, e.g., using an isotropic etch.

In various embodiments, the bottom spacer layer 150 can have a thickness in a range of about 3 nm to about 10 nm, or about 5 nm to about 7 nm, although other thicknesses are also contemplated. The bottom spacer layer 150 can cover a lower portion of the vertical fins 131 up to the thickness of the bottom spacer layer 150.

In various embodiments, the bottom spacer layer 150 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The bottom spacer layer 150 can be a material different from the fin templates 140 to allow selective removal.

Figure 4:
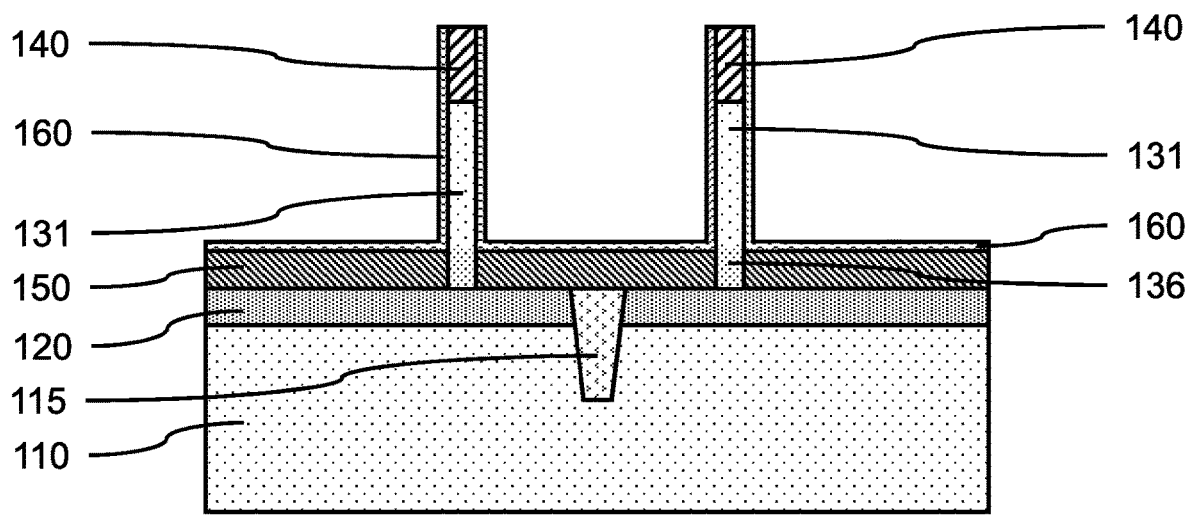
FIG. 4 is a cross-sectional side view showing a gate dielectric layer formed on the bottom spacer layer and the plurality of vertical fins and fin templates, in accordance with an embodiment of the present invention.

FIG. 4 is a cross-sectional side view showing a gate dielectric layer formed on the bottom spacer layer and the plurality of vertical fins and fin templates, in accordance with an embodiment of the present invention.

In one or more embodiments, a gate dielectric layer 160 can be formed on the bottom spacer layer 150 and the plurality of vertical fins 131 and fin templates 140, where the gate dielectric layer 160 can be formed by a conformal deposition, for example, atomic layer deposition (ALD), plasma enhanced ALD (PEALD), or low pressure CVD (LPCVD). The gate dielectric layer 160 can cover exposed surfaces of the bottom spacer layer 150, vertical fins 131, and fin templates 140.

In various embodiments, the gate dielectric layer 160 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 160 can have a thickness in a range of about 1 nm to about 3 nm, or about 2 nm, although other thicknesses are also contemplated.

In one or more embodiments, a lower extension region 136 can be formed in a lower portion of the vertical fins 131, where the lower extension region 136 can be formed by a heat treatment to diffuse dopants from the bottom source/drain layer 120 into the adjoining vertical fins 131. The lower extension region 136 can be adjacent to the bottom spacer layer 150, and may extend above the top surface of the bottom spacer layer to overlap a gate structure.

Figure 5:
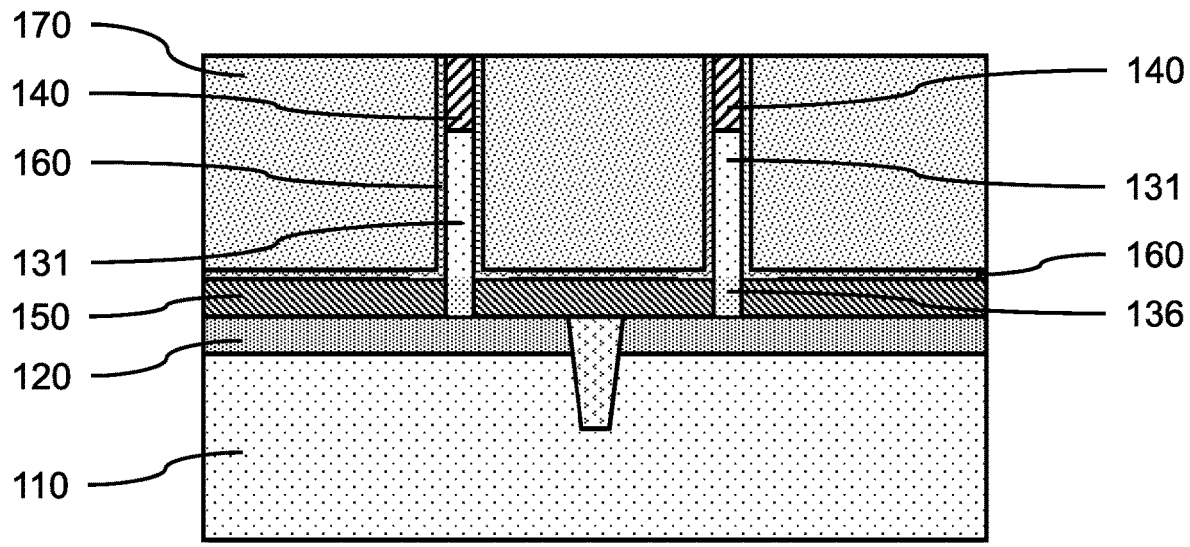
FIG. 5 is a cross-sectional side view showing a gate electrode formed on the gate dielectric layer, in accordance with an embodiment of the present invention.

FIG. 5 is a cross-sectional side view showing a gate electrode formed on the gate dielectric layer, in accordance with an embodiment of the present invention.

In one or more embodiments, a gate electrode 170 can be formed on the gate dielectric layer 160, where the gate electrode 170 can be formed by a blanket deposition (e.g., CVD, PECVD)), a conformal deposition (e.g., ALD, PEALD), or a combination thereof. The gate electrode 170 can have multiple layers, including a work function layer on the gate dielectric layer 180 and a conductive gate fill on the work function layer, where the work function layer can be formed by a conformal deposition and the conductive gate fill can be formed by a blanket deposition.

In various embodiments, the work function layer can be a conducting metallic nitride or carbide compound material, for example, tantalum nitride (TaN), titanium nitride (TiN), tantalum carbide (TaC), titanium carbide (TiC), titanium aluminum carbide (TiAlC), and combinations thereof.

In various embodiments, the conductive gate fill can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

The gate dielectric layer 160 and a gate electrode 170 can form an active gate structure on one or more vertical fin(s) 131 and the bottom spacer layer 150. Any suitable patterning technique, such as lithography followed by an etch process, can be used to remove gate material from predetermined regions of the substrate 110.

Figure 6:
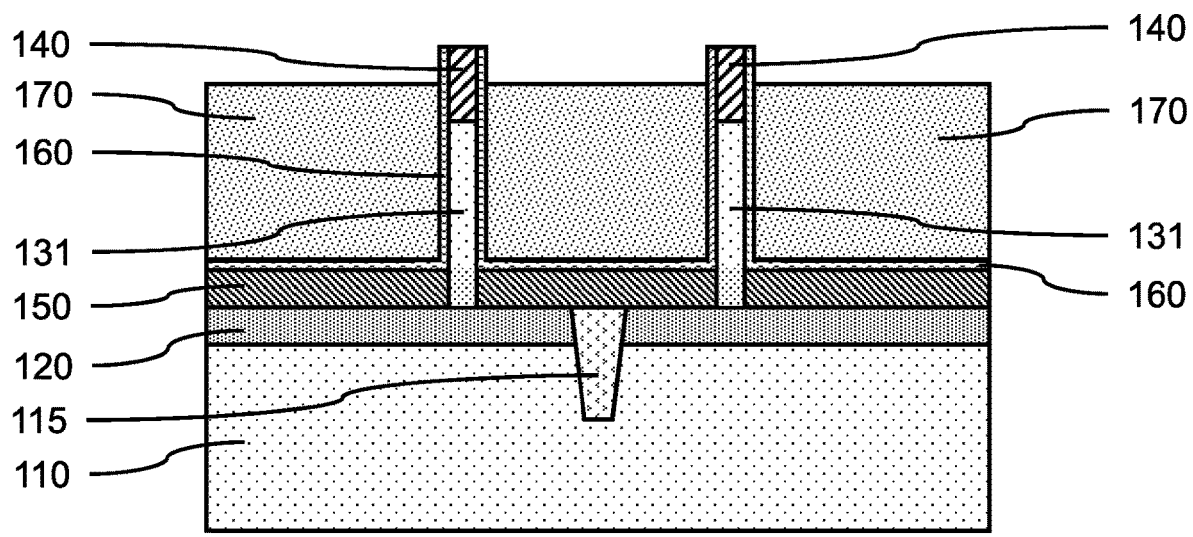
FIG. 6 is a cross-sectional side view showing the gate electrode recessed to expose an upper portion of the gate dielectric layer on the fin templates, in accordance with an embodiment of the present invention.

FIG. 6 is a cross-sectional side view showing the gate electrode recessed to expose an upper portion of the gate dielectric layer on the fin templates, in accordance with an embodiment of the present invention.

In one or more embodiments, the height of the gate electrode 170 can be reduced to expose an upper portion of the gate dielectric layer 160 on the sides of fin templates 140. The gate electrode 170 can be recessed using a selective etch, for example, a reactive ion etch (RIE), where the conductive gate fill can be removed by RIE, and an exposed portion of the work function layer can be removed using a selective, isotropic etch, for example, a wet chemical etch or dry plasma etch. The distance that the height of the gate electrode 170 is reduced can be less than the height of the fin templates 140, so at least a portion of the fin templates 140 extends below the top of the gate electrode 170, and the gate electrode 170 extends above the vertical fin(s) 131.

Figure 7:
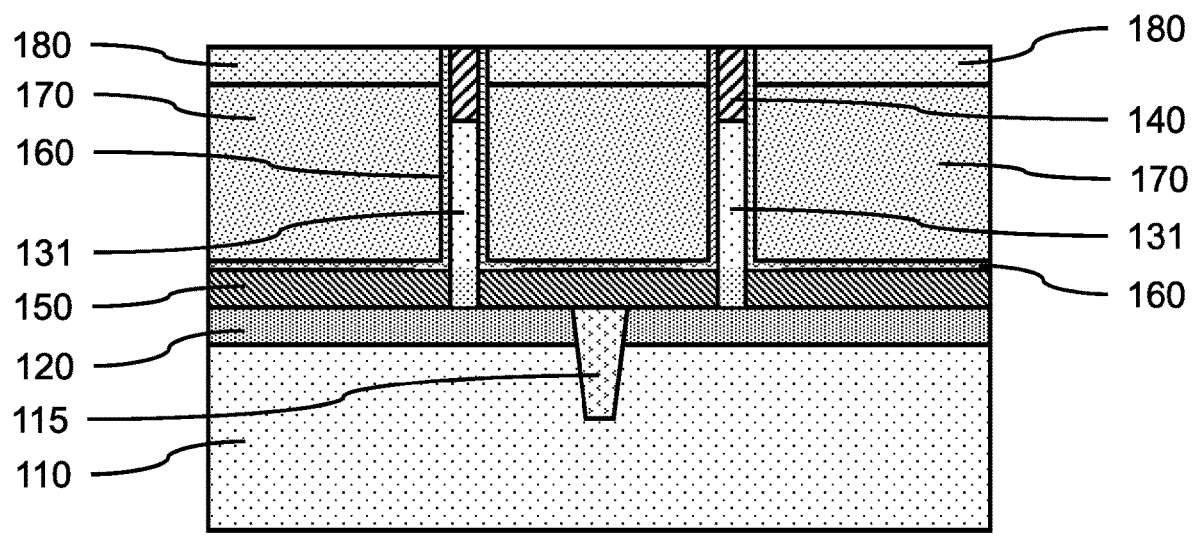
FIG. 7 is a cross-sectional side view showing a top spacer layer formed on the recessed gate electrode and exposed upper portion of the gate dielectric layer, in accordance with an embodiment of the present invention.

FIG. 7 is a cross-sectional side view showing a top spacer layer formed on the recessed gate electrode and exposed upper portion of the gate dielectric layer, in accordance with an embodiment of the present invention.

In one or more embodiments, a top spacer layer 180 can be formed on the recessed gate electrode 170 and exposed upper portion of the gate dielectric layer 160. The top spacer layer 180 can be formed by a conformal deposition (e.g., ALD, PEALD) or blanket deposition (e.g., CVD, PECVD), and a chemical-mechanical polishing (CMP) used to remove excess material down to the surface of the fin templates 140. A top surface of the fin templates 140 and top edges of the gate dielectric layer 160 can be exposed through the top spacer layer 180.

Figure 8:
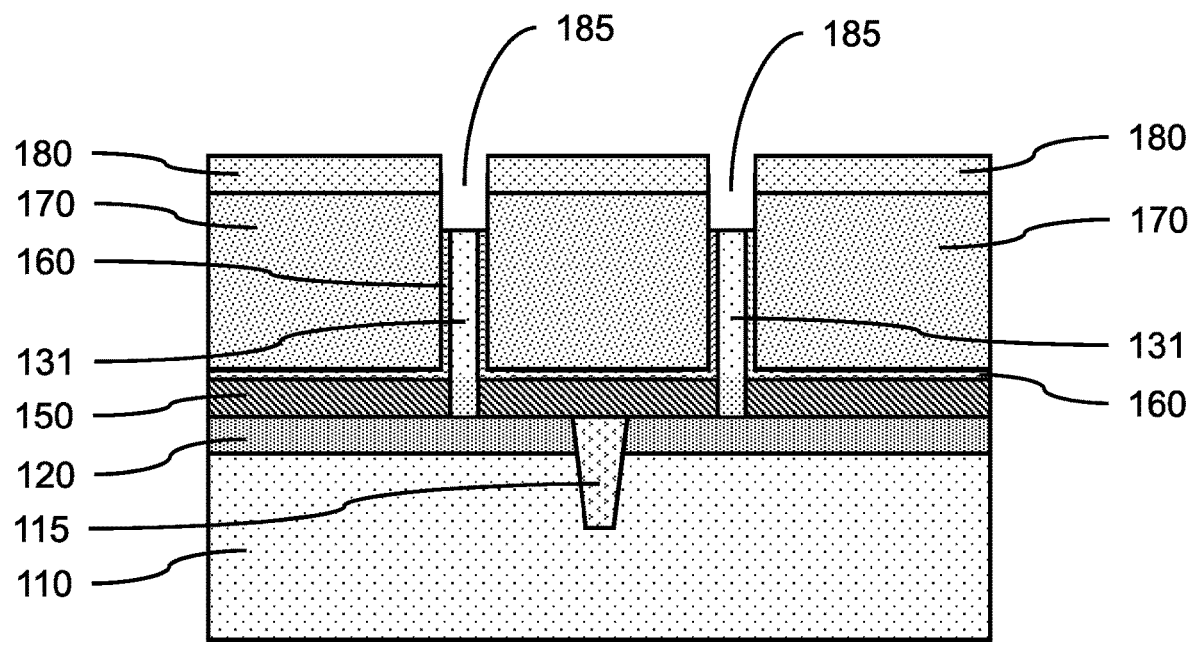
FIG. 8 is a cross-sectional side view showing the fin templates and a portion of the gate dielectric layer removed to expose a portion of the recessed gate electrode, in accordance with an embodiment of the present invention.

FIG. 8 is a cross-sectional side view showing the fin templates and a portion of the gate dielectric layer removed to expose a portion of the recessed gate electrode, in accordance with an embodiment of the present invention.

In one or more embodiments, the fin templates 140 can be removed to form openings 185 in the top spacer layer 180 that expose the inner sidewalls of the gate dielectric layer 160 and top surface of the vertical fins 131, where the fin templates 140 can be removed by a selective directional etch and/or selective isotropic etch.

In one or more embodiments, upper portions of the gate dielectric layer 160 exposed by removal of the fin templates 140 can be removed using a selective isotropic etch to expose sidewalls of the recessed gate electrode 170, which can include a work function layer on the gate dielectric layer. A work function layer can be removed by a separate isotropic etch. The expose sidewalls of the recessed gate electrode 170 can be above the top surface of the vertical fins 131.

Figure 9:
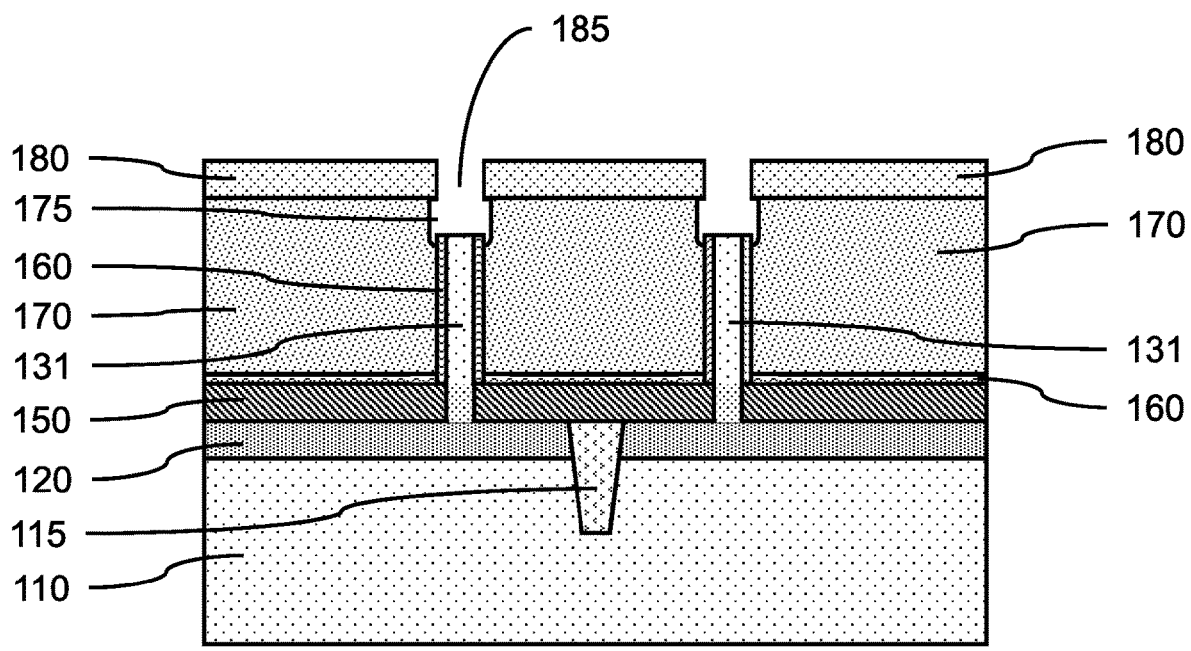
FIG. 9 is a cross-sectional side view showing the exposed portion of the recessed gate electrode laterally widened to form a cavity in the gate structure below the top spacer layer, in accordance with an embodiment of the present invention.

FIG. 9 is a cross-sectional side view showing the exposed portion of the recessed gate electrode laterally widened to form a cavity in the gate structure below the top spacer layer, in accordance with an embodiment of the present invention.

In one or more embodiments, the exposed portion of the recessed gate electrode 170 can be laterally widened to form a cavity 175 below the top spacer layer 180, where the portion of the recessed gate electrode 170 can be removed with an isotropic etch (e.g., wet chemical etch, dry plasma etch) to laterally widened the space formed by removal of the fin template 140 and gate dielectric layer 160. Forming the cavity 175 in the gate structure can partially undercut the top spacer layer 180 and expose a portion of the outer sidewall of the gate dielectric layer 160.

In one or more embodiments, the lateral etch can be about 1.5 nm to about 6 nm, or about 3 nm to about 5 nm, or about 4 nm on each side, such that the width of the cavity can be about 3 nm to about 12 nm, or about 6 nm to about 10 nm, or about 8 nm wider than the width of the vertical fin 131 and thickness of the gate dielectric layer 160.

Figure 10:
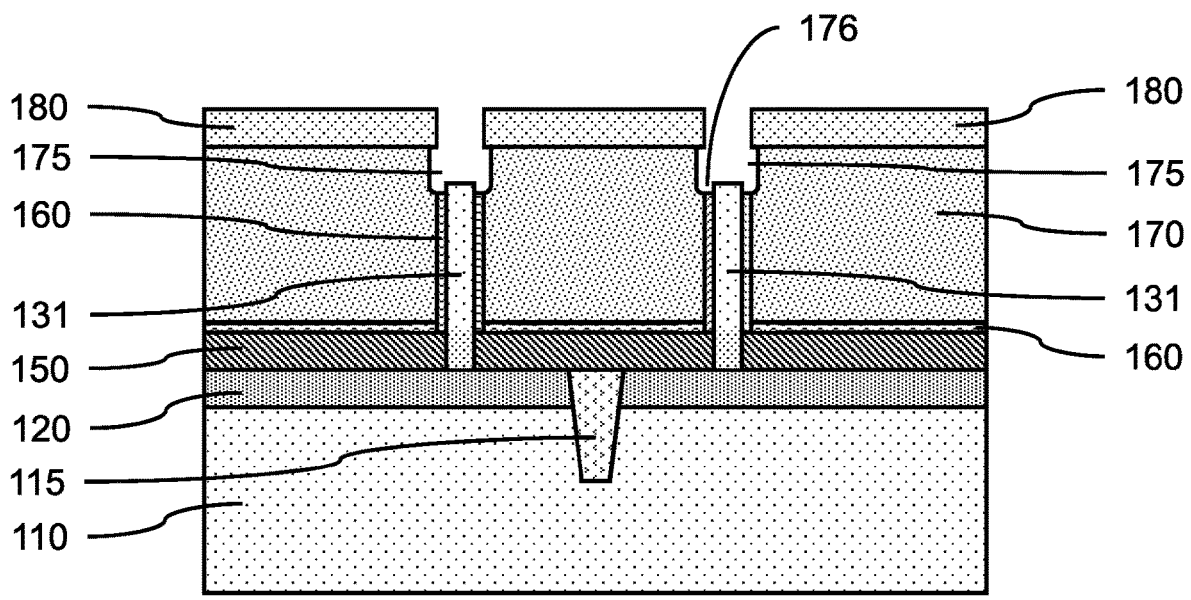
FIG. 10 is a cross-sectional side view showing an exposed portion of the gate dielectric layer removed to form a groove around each of the vertical fins, in accordance with an embodiment of the present invention.

FIG. 10 is a cross-sectional side view showing an exposed portion of the gate dielectric layer removed to form a groove around each of the vertical fins, in accordance with an embodiment of the present invention.

In one or more embodiments, the portion of the gate dielectric layer 160 exposed by the lateral etch of the recessed gate electrode 170 can be removed using a selective isotropic etch to expose sidewall portions of the vertical fins 131. The removal of the gate dielectric layer 160 with an isotropic etch can form grooves 176 around the vertical fins 131, where the grooves are below the top surface of the vertical fins. The grooves can have a depth below the top surface of the vertical fins approximately equal to the distance of the lateral etch, and curved surfaces, due to the isotropic nature of the etch.

Figure 11:
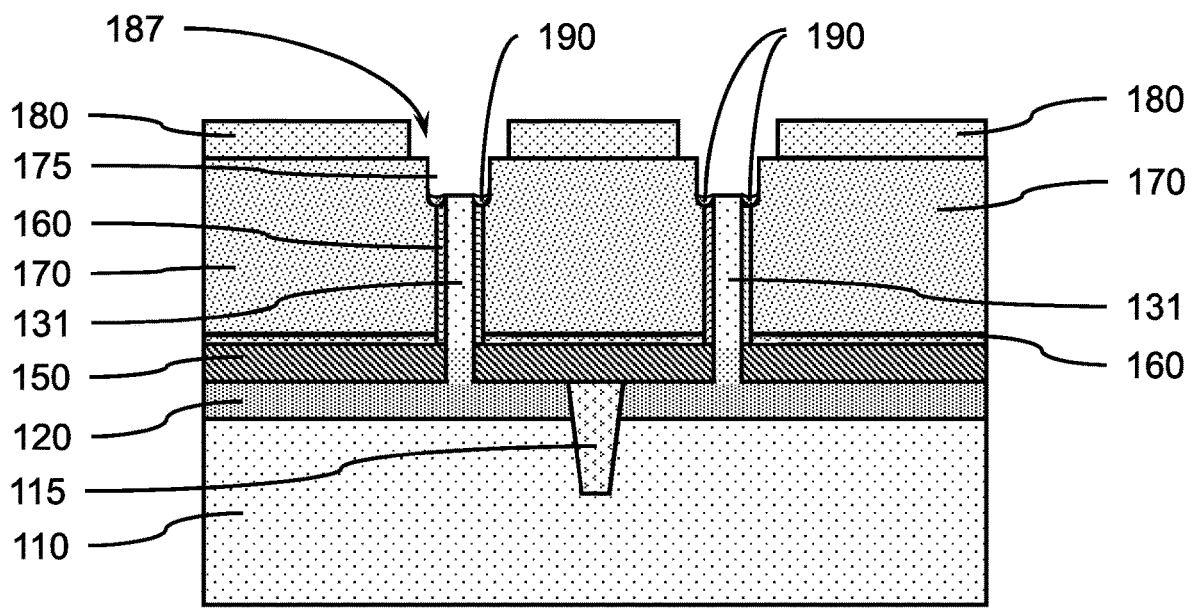
FIG. 11 is a cross-sectional side view showing the opening in the top spacer layer enlarged to expose a portion of the top surface of the recessed gate electrode and cavity, and a gate plug formed in each of the grooves, in accordance with an embodiment of the present invention.

FIG. 11 is a cross-sectional side view showing the opening in the top spacer layer enlarged to expose a portion of the top surface of the recessed gate electrode and cavity, and a gate plug formed in each of the grooves, in accordance with an embodiment of the present invention.

In one or more embodiments, the opening(s) 185 formed in the top spacer layer 180 by removal of the fin template(s) 140 and gate dielectric layer 160 can be enlarged by an isotropic etch, so the opening(s) are larger than the width of the cavit(ies) 175. The thickness of the top spacer layer 180 can also be reduced by an amount approximately equal to the distance of the isotropic etch. A portion of the top surface of the recessed gate electrode 170 can be exposed by widening the top spacer layer 180 to form a step 187.

In one or more embodiments, gate plugs 190 can be formed in the grooves 176 around the vertical fins 131, where the gate plugs 190 can be formed by a conformal deposition (e.g., ALD, PEALD) of a plug layer that fills in the grooves 176 and covers the exposed sidewalls of the recessed gate electrode 170 in the cavity 175 and the sidewalls of the top spacer layer 180 exposed by the opening(s) 185. In various embodiments, the plug layer can be etched back, for example, using RIE, to leave gate plugs 190 in the grooves 176. The gate plugs 190 can have a convex-concave shape due to the Curved surfaces of the grooves 176 and etch-back process.

In one or more embodiments, the plug layer and resulting gate plugs 190 can be a high-K dielectric material, where a high-K material has a K value of equal or greater than 7.0, where K is the relative dielectric constant. A high-k dielectric material can include, but not limited to, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

Figure 12:
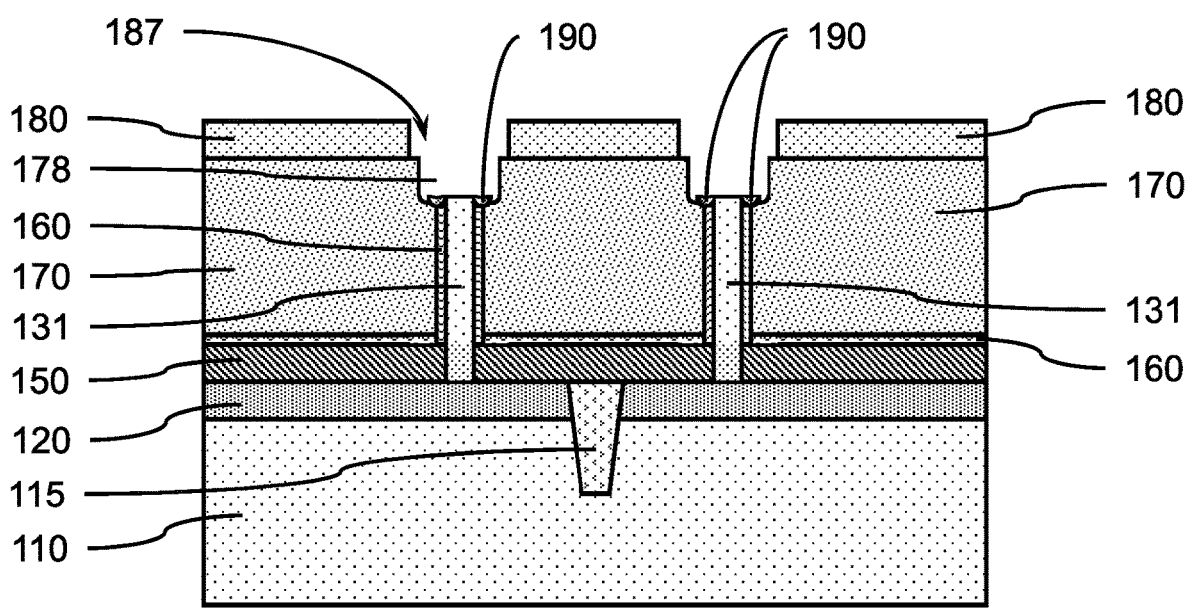
FIG. 12 is a cross-sectional side view showing the gate electrode further recessed to form an enlarged cavity and expose a side portion of the gate plugs, in accordance with an embodiment of the present invention.

FIG. 12 is a cross-sectional side view showing the recessed gate electrode further recessed to form an enlarged cavity and expose a side portion of the gate plugs, in accordance with an embodiment of the present invention.

In one or more embodiments, portions of the recessed gate electrode 170 around the cavity 175 can be removed to form an enlarged cavity 178 that exposes a side portion of the gate plugs 190, where the additional portion of the recessed gate electrode 170 can be removed with an isotropic etch to further widen the cavities 175. The area of the top surface of the recessed gate electrode 170 forming the step 187 can be reduced by the enlargement of the cavity 175.

In one or more embodiments, the second lateral etch can be about 1 nm to about 3 nm, or about 2 nm on each side, such that the width of the enlarged cavity 178 can be about 2 nm to about 6 nm, or about 4 nm wider than the width of the cavity 175.

Figure 13:
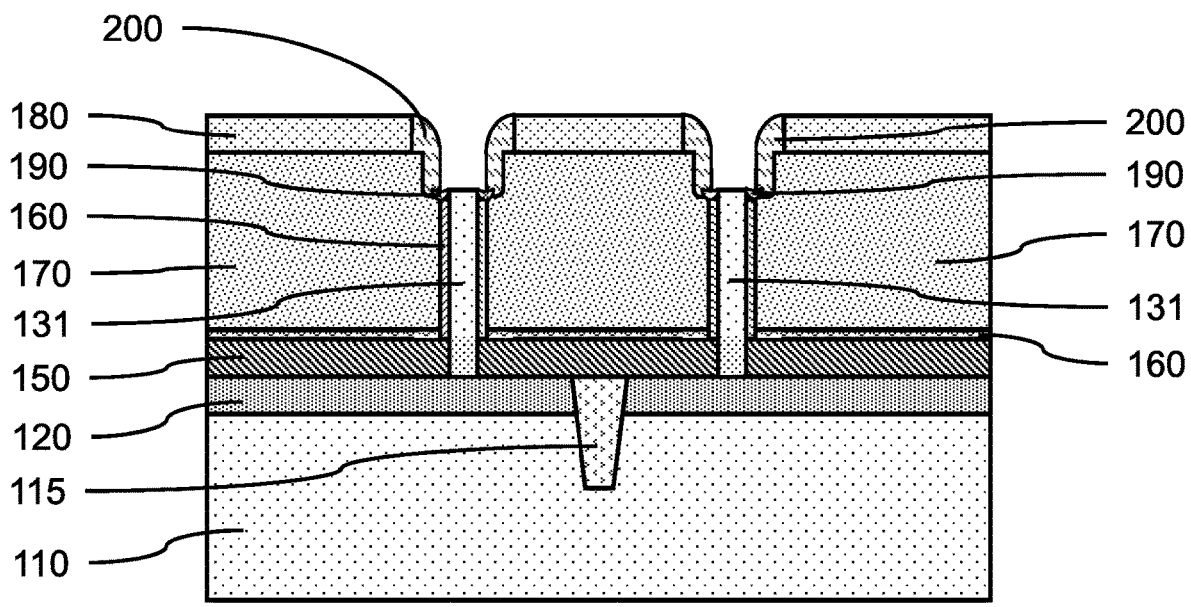
FIG. 13 is a cross-sectional side view showing a dielectric collar formed in the enlarged cavity on the gate plugs, in accordance with an embodiment of the present invention.

FIG. 13 is a cross-sectional side view showing a dielectric collar formed in the enlarged cavity on the gate plugs, in accordance with an embodiment of the present invention.

In one or more embodiments, a dielectric collar 200 can be formed in the enlarged cavity 178 on the gate plugs 190, where the dielectric collar 200 can be formed by a conformal deposition (e.g., ALD, PEALD), and a central portion removed using a selective directional etch (e.g., RIE) to expose the top surface of the vertical fin 131. A portion of the gate plugs 190 can be exposed by the RIE etch, where a portion of the top surface of the gate plugs 190 can be exposed between the inner sidewalls of the dielectric collar 200.

In various embodiments, the dielectric collar 200 can have a lateral thickness in a range of about 3 nm to about 10 nm, or about 5 nm to about 6 nm. The dielectric collar can cover the step.

In various embodiments the dielectric collar 200 can be a dielectric material, including, but not limited to, silicon oxide (SiO) or a low-k material, where the low-K material has a K value of less than 7.0, in contrast to the high-K material having a K value of equal or greater than 7.0. A low-k dielectric material can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ), methylsilsesquioxane (MSQ), silicon carbide (SiC), silicon oxynitride (SiON), silicon-carbon-nitride (SiCN), boron nitride (BN), silicon boron nitride (SiBN), silicon boron carbonitride (SiBCN), silicon oxycabonitride (SiOCN), silicon oxide (SiO), and combinations thereof.

Figure 14:
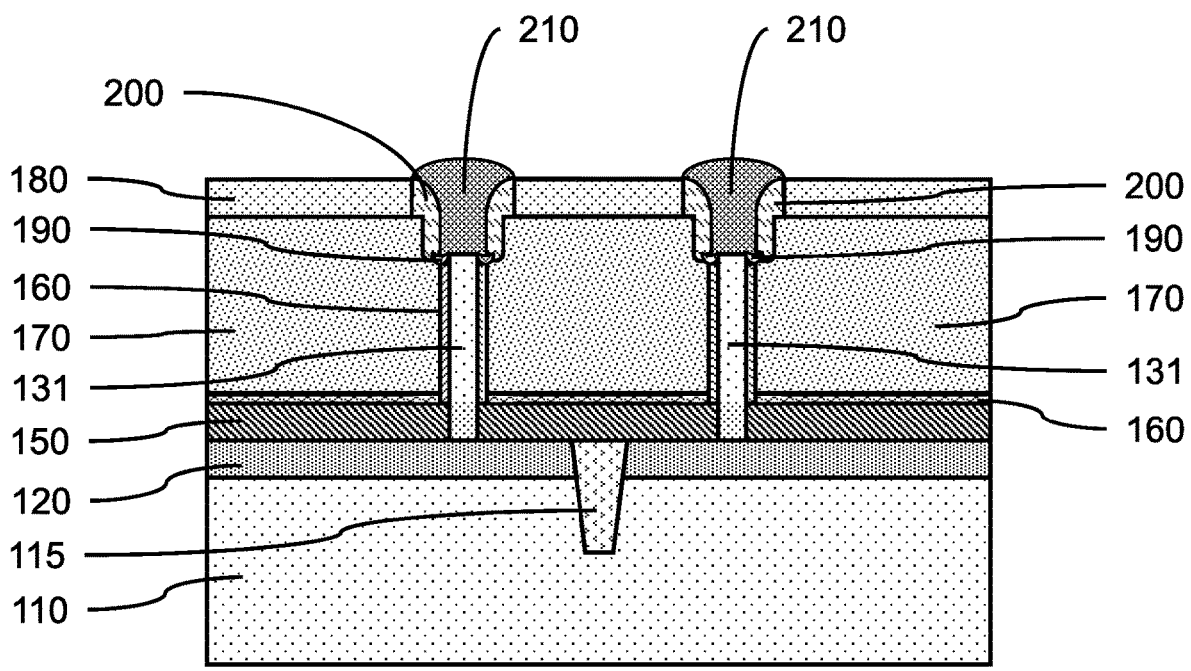
FIG. 14 is a cross-sectional side view showing a top source/drain formed within the dielectric collars, in accordance with an embodiment of the present invention.

FIG. 14 is a cross-sectional side view showing a top source/drain formed within the dielectric collars, in accordance with an embodiment of the present invention.

In one or more embodiments, a top source/drain 210 can be formed within the dielectric collars 200, where the top source/drain 210 can be formed by epitaxial or heteroepitaxial growth on the top surface of the vertical fins 131. The top source/drain 210 can be an n-doped or p-doped semiconductor material, where the dopant type of the top source/drain 210 can match the dopant type of the bottom source/drain layer 120. The semiconductor material can be the same as or different from the semiconductor material of the vertical fins 131 and/or the bottom source/drain layer 120.

Figure 15:
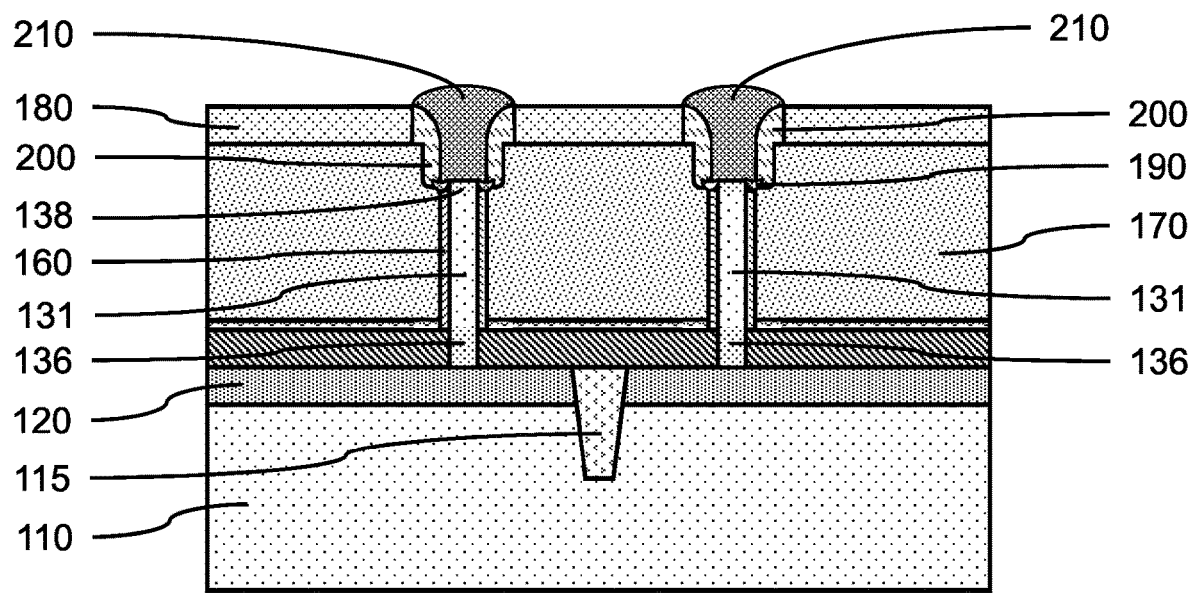
FIG. 15 is a cross-sectional side view showing upper extension regions formed in the vertical fins below the top source/drains, in accordance with an embodiment of the present invention.

FIG. 15 is a cross-sectional side view showing upper extension regions formed in the vertical fins below the top source/drains, in accordance with an embodiment of the present invention.

In one or more embodiments, upper extension regions 138 can be formed in the vertical fins 131 below the top source/drains 210, where the upper extension regions 138 can be formed by a heat treatment that causes dopants to migrate from the top source/drains 210 into a region of the vertical fins 131 adjoining the top source/drains.

In one or more embodiments, the upper extension regions 138 can be formed by a heat treatment at a temperature in a range of about 600° C. to about 1250° C., where the thermal budget can be minimized by conducting the heat treatment for a duration, for example, of less than one (1) second (sec). In various embodiments, a flash anneal, rapid thermal anneal, spike anneal, laser anneal, or any suitable combination of these techniques can be used for the heat treatment. In some embodiments, dopants can already be incorporated in the upper extension region(s) 138 during the epitaxial growth of the top source/drain(s) 210, so the heat treatment may be skipped.

Figure 16:
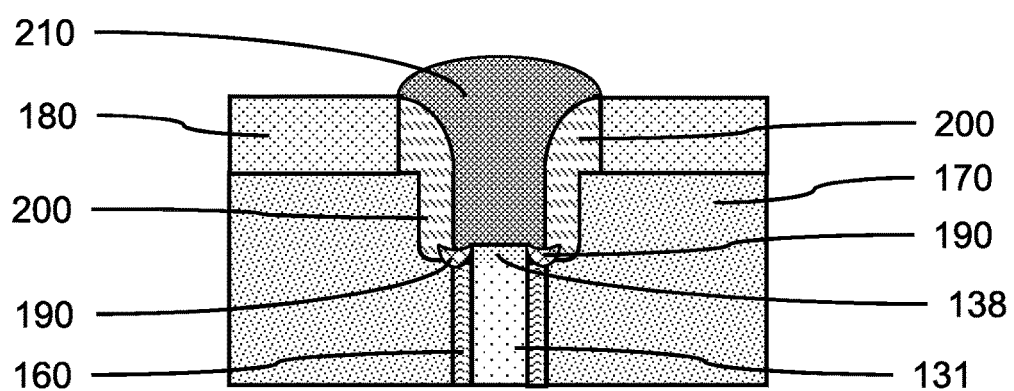
FIG. 16 is an enlarged view of the upper extension region in the vertical fins between the gate plugs, in accordance with an embodiment of the present invention.

FIG. 16 is an enlarged view of the upper extension region in the vertical fins between the gate plugs, in accordance with an embodiment of the present invention.

In various embodiments, the upper extension regions 138 can extend down into the vertical fin(s) by a height of about 4 nm, or about a height of 4 nm or less, or about 2 nm to about 4 nm, from the interface with the top source/drain(s) 210, where the upper extension regions 138 can underlap with the top edge of the gate electrode 170 at the gate plug 190/gate dielectric layer 160 interface. The bottom edge of the upper extension region 138 can be above the bottom edge of the gate plug.

The lower extension region 136 can overlap the bottom edge of the gate electrode 170. The gate electrode 170 can extend above the gate plug 190/gate dielectric layer 160 interface.

In various embodiments, formation of the dielectric collar 200 on the gate plugs 190 can form a composite high-K and low-K gate spacer that has different electrical characteristics adjacent to an upper extension region 138 and a top source/drain 210. The high-K gate plugs 190 can be narrower (i.e., thinner) than the dielectric collar 200, so can provide enhanced coupling between the gate electrode 170 and the upper extension regions 138 and device channel/vertical fin due to fringing electric field from the gate. When the transistor device is turned on, a higher field can allow more carriers in the upper extension region, so a lower resistance of the upper extension region can be provided. A lower extension region resistance improves the drive current of the transistor device. When the transistor device is turned off, the high-k gate plugs 190 can provide enhanced coupling between the active gate structure and the upper extension region 138/fin channel. The enhanced fringe electric field from gate structure improves the electrostatics of the transistor device and thus can reduce the off-state leakage current. The thicker low-K dielectric collar 200 can provide electric isolation of the top source/drains 210 from the gate electrode 170, and provide reduced parasitic capacitances compared to a non-composite gate spacer. The low-k dielectric collar 200 can reduce the overall gate-to-top source/drain parasitic capacitance. The shorter upper extension regions 138 can provide less capacitance increase due to coupling of the gate electrode 170 to the upper extension region 138.

Figure 17:
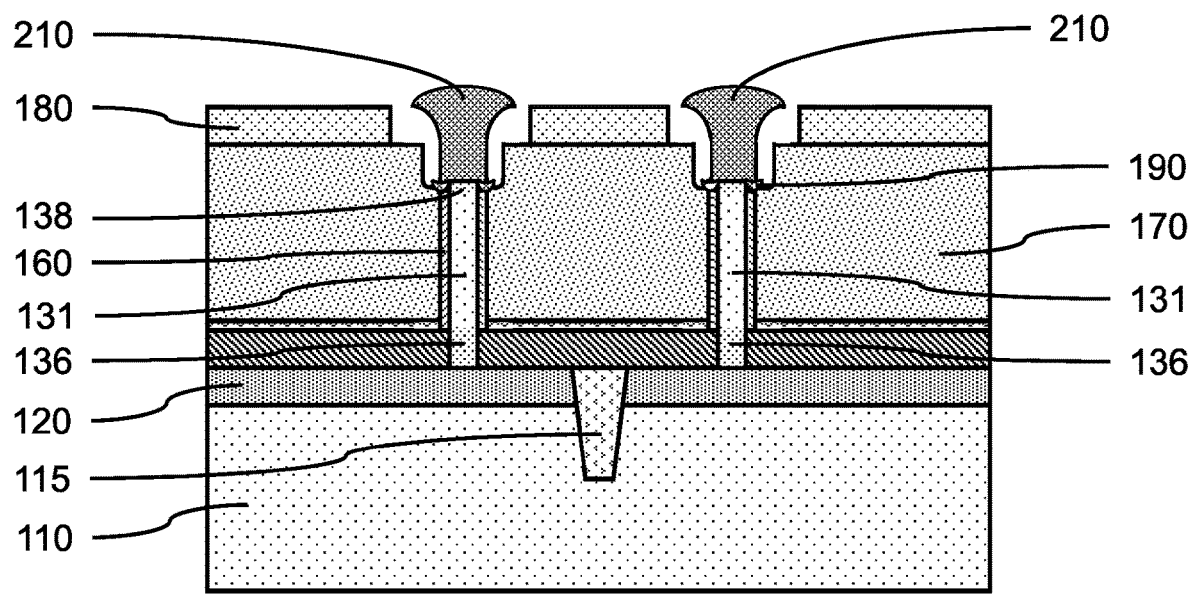
FIG. 17 is a cross-sectional side view showing the dielectric collars removed to form hollow spaces adjacent to the top source/drains and in the enlarged cavity, where the dielectric collars include air gaps, in accordance with another embodiment of the present invention.

FIG. 17 is a cross-sectional side view showing the dielectric collars removed to form hollow spaces adjacent to the top source/drains and in the enlarged cavity, where the dielectric collars include air gaps, in accordance with another embodiment of the present invention.

In one or more embodiments, a portion of the top spacer 180 or the entire top spacer 180 can be removed from around the top source/drains 210 through selective etching to expose a portion of the dielectric collar 200. The dielectric collar 200 can then be removed with a selective isotropic etch to form a hollow space adjacent to the top source/drains 210 and in the enlarged cavity 178. In various embodiments, the dielectric collar 200 can be a sacrificial material that can be selectively removed from between the gate electrode 170 and top source/drain 210.

Figure 18:
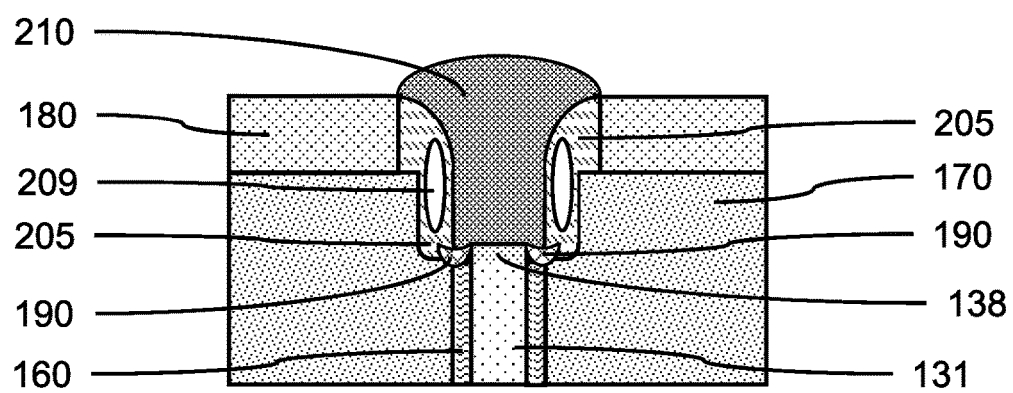
FIG. 18 is a cross-sectional side view showing a top source/drain formed within the dielectric collars, where the dielectric collars include air gaps, in accordance with another embodiment of the present invention.

FIG. 18 is a cross-sectional side view showing a second dielectric collar formed around the top source/drain, where the second dielectric collars include air gaps, in accordance with another embodiment of the present invention.

In one or more embodiments, a second dielectric collar 205 can be formed with an air gap 209 in the hollow space by pinching off the formation of the second dielectric collar 205 using a non-conformal deposition after removing the first dielectric collar 200. Pinching off within the narrow confines of the hollow space due to the change in widths of the hollow space can form the air gaps 209 within the second dielectric collar 205.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as apparent to one of ordinary skill in the arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and a method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor device, comprising:
    forming a vertical fin and fin template on a bottom source/drain layer, wherein the fin template is on the vertical fin;
    forming a gate structure on the vertical fin and fin template;
    forming a top spacer layer on the gate structure;
    removing the fin template to form an opening in the top spacer layer;
    removing a portion of a gate electrode of the gate structure exposed in the opening to form a cavity in the gate electrode below the top spacer; and
    removing a portion of a gate dielectric layer of the gate structure to form a groove around the vertical fin.

2. The method of claim 1, further comprising forming a gate plug in the groove.

3. The method of claim 2, further comprising widening the cavity to form an enlarged cavity.

4. The method of claim 3, further comprising forming a dielectric collar in the enlarged cavity.

5. The method of claim 4, further comprising forming a top source/drain on the vertical fin within the dielectric collar.

6. The method of claim 5, further comprising heat treating the top source/drain to form an upper extension region in the vertical fin.

7. The method of claim 6, wherein the upper extension region has a height of 4 nm or less.

8. The method of claim 6, wherein the gate plug is a high-K dielectric material.

9. The method of claim 8, wherein the dielectric collar is a low-K dielectric material.

\* \* \* \* \*